(12) United States Patent
Yoneda

(10) Patent No.: US 6,800,935 B2
(45) Date of Patent: Oct. 5, 2004

(54) SWITCHING CIRCUIT WITH IMPROVED SIGNAL BLOCKING EFFECT IN OFF MODE

(75) Inventor: Toshiharu Yoneda, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 16 days.

(21) Appl. No.: 10/256,692

(22) Filed: Sep. 27, 2002

(65) Prior Publication Data

US 2003/0062935 A1 Apr. 3, 2003

(30) Foreign Application Priority Data

Oct. 2, 2001 (JP) ........................................ 2001-306054

(51) Int. Cl.[7] .............................................. H01L 29/41
(52) U.S. Cl. ....................... 257/728; 257/698; 257/700; 257/531; 257/532
(58) Field of Search ................................ 257/698, 700, 257/728, 531, 532

(56) References Cited

U.S. PATENT DOCUMENTS

| 3,138,768 A | | 6/1964 | Evans | |
|---|---|---|---|---|
| 5,656,874 A | | 8/1997 | Kato et al. | |
| 6,020,853 A | * | 2/2000 | Richards et al. | ..... 343/700 MS |

FOREIGN PATENT DOCUMENTS

| EP | 1071221 A1 | 1/2001 |
|---|---|---|
| JP | 09-036603 | 2/1997 |

OTHER PUBLICATIONS

"The Application of Acoustic Charge Transport Technologies to Wideband Communication Systems;" Ward C.R. et al.; Proceedings of the National Telesystems Conference (NTC); Washington; May 19–20, 1992; New York, IEEE, U.S.A.; pp. 15–1 through 15–12.

* cited by examiner

Primary Examiner—Jerome Jackson
(74) Attorney, Agent, or Firm—Brinks Hofer Gilson & Lione

(57) ABSTRACT

A switching circuit includes an insulating substrate including two signal transmission lines; a switching diode mounted, in series between the two signal transmission lines, on the insulating substrate, wherein an anode terminal and a cathode terminal are connected to the two signal transmission lines, and the switching diode is turned on or off; and a conductive pattern formed, below the switching diode, on a mounting face of the insulating substrate on which the switching diode is mounted, wherein the conductive pattern is grounded. There are stray capacitances between the anode terminal and the conductive pattern and between the cathode terminal and the conductive pattern.

3 Claims, 3 Drawing Sheets

SWITCHING CIRCUIT WITH IMPROVED SIGNAL BLOCKING EFFECT IN OFF MODE

BACKGROUND OF THE INVENTION

1. Field of the Invention

The present invention relates to switching circuits for passing or blocking a signal using switching diodes that are turned on or off.

2. Description of the Related Art

FIG. 6 shows the configuration of a known switching circuit. Two conductive patterns 22 and 23 for transmitting signals are formed on an insulating substrate 21. One end of the conductive pattern 22 is provided with a connection land 22a, and one end of the conductive pattern 23 is provided with a connection land 23a. The connection lands 22a and 23a oppose each other. A switching diode 24 is mounted on the insulating substrate 21. An anode terminal 24a is connected to the connection land 22a by soldering, and a cathode terminal 24b is connected to the connection land 23a by soldering.

When the switching diode 24 is turned on by a voltage switching circuit (not shown), a signal input to the conductive pattern 22 is transmitted to the other conductive pattern 23 through the switching diode 24. When the switching diode 24 is turned off, signal transmission is blocked.

In the known switching circuit having the switching diode 24, whose equivalent circuit is shown in FIG. 7, the switching diode 24 has a junction capacitance Cj at a PN junction, an inductance La at the anode terminal 24a, an inductance Lb at the cathode terminal 24b, and a stray capacitance Cs between the terminals 24a and 24b. As shown in FIG. 8, when the switching diode 24 is turned off, the switching diode 24 has the same characteristics as those of a high-pass filter. Thus, the switching diode 24 transmits a high-frequency signal S without greatly attenuating the signal.

SUMMARY OF THE INVENTION

Accordingly, it is an object of the present invention to increase the signal blocking effect when a switching diode is turned off.

In order to achieve the foregoing objects, a switching circuit is provided according to the present invention. The switching circuit includes an insulating substrate including two signal transmission lines: a switching diode mounted, in series between the two signal transmission lines, on the insulating substrate, wherein an anode terminal and a cathode terminal are connected to the two signal transmission lines, and the switching diode is turned on or off; and a conductive pattern formed, below the switching diode, on a mounting face of the insulating substrate on which the switching diode is mounted, wherein the conductive pattern is grounded. Accordingly, there are stray capacitances between the conductive pattern and both ends of the anode terminal of the switching diode and stray capacitances between the conductive pattern and both ends of the cathode terminal of the switching diode. These stray capacitances and the inductance at each terminal form a low pass filter. When the switching diode is turned off, the transmission characteristics between the signal transmission lines are such that attenuation can be performed at high frequencies. Accordingly, a high-frequency signal can be sufficiently attenuated.

The conductive pattern may extend to both sides of the switching diode in the direction orthogonal to a direction in which the two terminals of the switching diode are connected with each other, and the conductive pattern may be grounded at both sides of the switching diode. The entire conductive pattern can be sufficiently grounded. As a result, the value of each stray capacitance between the conductive pattern and each terminal can be stabilized.

A ground conductor may be formed on a face opposite to the mounting face of the insulating substrate. Through holes connected to the conductive pattern may be provided at both sides of the switching diode. The conductive pattern may be connected to the ground conductor through the through holes. This eliminates the need to increase the area of the conductive pattern. Thus, a larger area of the mounting face of the insulating substrate can be used for the other circuit wiring.

DESCRIPTION OF THE PREFERRED EMBODIMENTS

Figure 1:
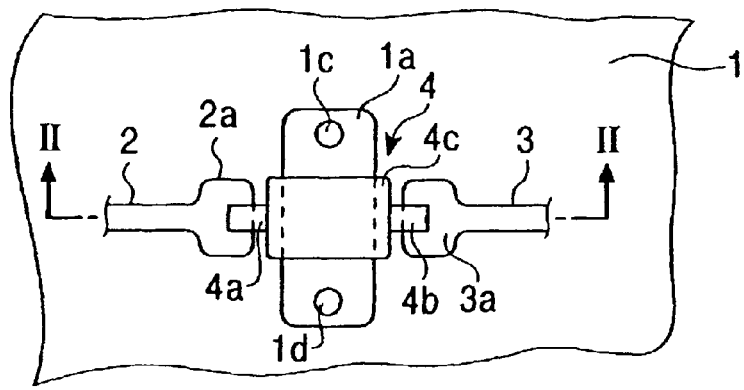
FIG. 1 is a plan view of the configuration of a switching circuit according to the present invention.
Figure 2:
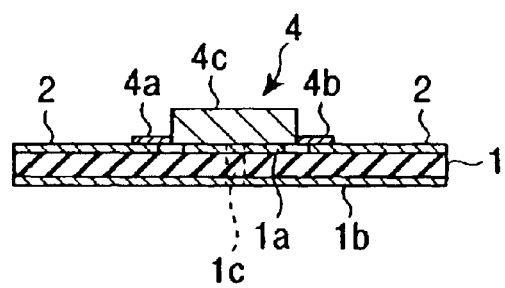
FIG. 2 is a sectional view of the configuration of the switching circuit according to the present invention taken along the line II—II of FIG. 1.

FIGS. 1 and 2 show a switching circuit according to the present invention. Two signal transmission lines 2 and 3 formed by conductive patterns are provided on an insulating substrate 1. One end of the signal transmission line 2 is provided with a connection land 2a, and one end of the signal transmission line 3 is provided with a connection land 3a. The connection lands 2a and 3a oppose each other. A switching diode 4 is mounted on the insulating substrate 1. An anode terminal 4a is connected to the connection land 2a by soldering, and a cathode terminal 4b is connected to the connection land 3a by soldering.

When the switching diode 4 is turned on by a voltage switching circuit (not shown), a signal input to the signal transmission line 2 is transmitted to the other signal transmission line 3 through the switching diode 4. When the switching diode 4 is turned off, signal transmission is blocked.

A conductive pattern 1a is provided, below the switching diode 4, on the insulating substrate 1. The conductive pattern 1a extends to both sides of a main body 4c of the switching diode 4 in the direction orthogonal to the direction in which the anode terminal 4a of the switching diode 4 is connected with the cathode terminal 4b. As shown in FIG. 2, a grounded pattern 1b, which is grounded, is formed on the bottom face of the insulating substrate 1. Through holes 1c and 1d are provided at both sides of the main body 4c of the switching diode 4. The conductive pattern 1a is connected to the grounded pattern 1b by the through holes 1c and 1d.

Figure 3:
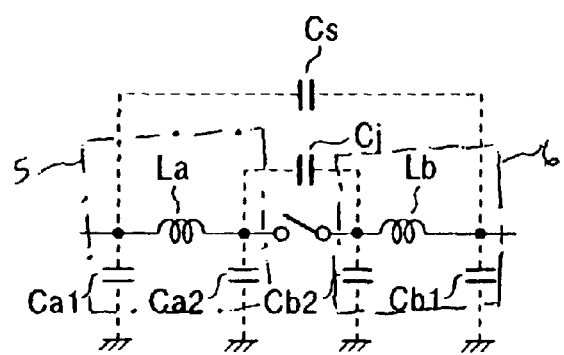
FIG. 3 is an equivalent circuit diagram of the switching circuit according to the present invention.

FIG. 3 shows the equivalent circuit of the switching circuit arranged as described above, including the switching diode 4 and the conductive pattern 1a.

The switching diode 4 has a junction capacitance Cj at the PN junction, an inductance La at the anode terminal 4a, an inductance Lb at the cathode terminal 4b, and a stray capacitance Cs between the anode terminal 4a and the cathode terminal 4b. The provision of the conductive pattern 1a below the switching diode 4 generates stray capacitances Ca1 and Ca2 between the conductive pattern 1a and both ends of the anode terminal 4a having the inductance La. Similarly, there are stray capacitances Cb1 and Cb2 between the conductive pattern 1a and both ends of the cathode terminal 4b having the inductance Lb.

As a result, a low-pass filter 5 is formed by the stray capacitance Ca1, the inductance La, and the stray capacitance Ca2. Similarly, a low-pass filter 6 is formed by the stray capacitance Cb1, the inductance Lb, and the stray capacitance Cb2.

Figure 4:
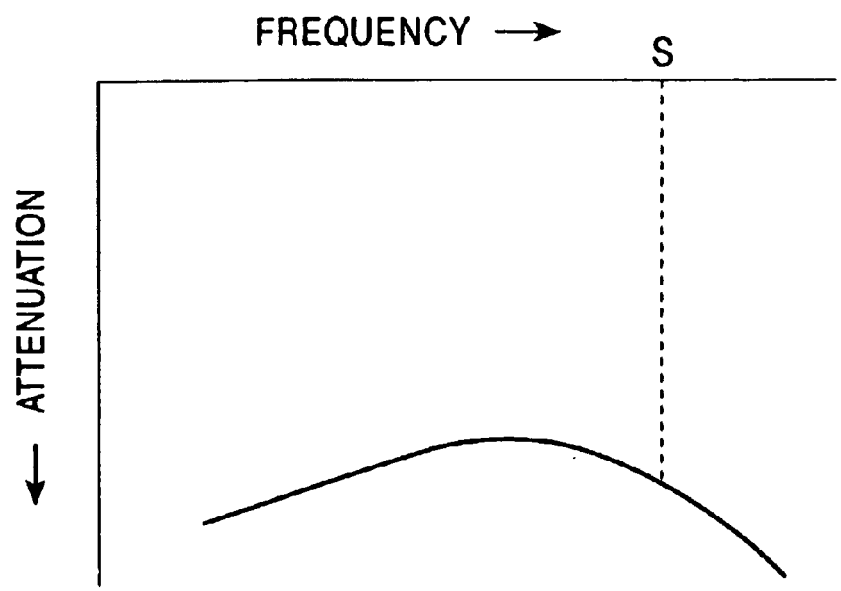
FIG. 4 is a graph showing the transmission characteristics of the switching circuit according to the present invention.

FIG. 4 shows the transmission characteristics between the signal transmission lines 2 and 3 when the switching diode 4 is turned off. At low frequencies, attenuation is performed by the switching diode 4. At high frequencies, attenuation is performed by the low-pass filters 5 and 6. As a result, a high-frequency signal S can be sufficiently attenuated.

Figure 5:
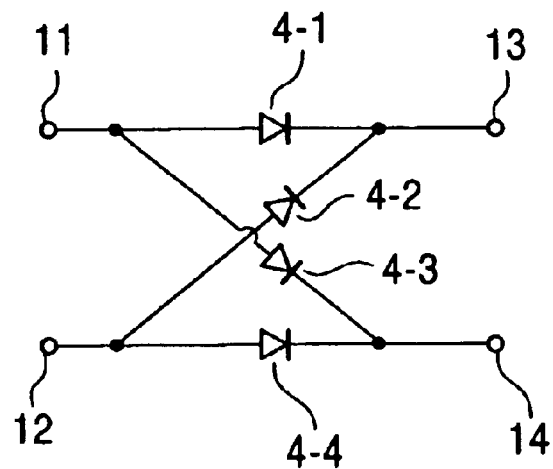
FIG. 5 is a circuit diagram of the configuration of a signal switching circuit using the switching circuit according to the present invention.
Figure 6:
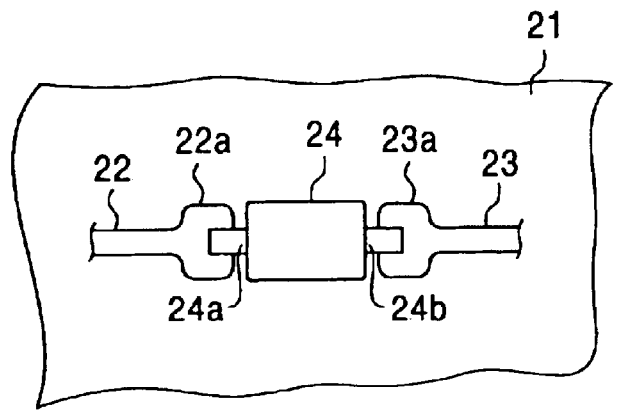
FIG. 6 is a plan view showing the configuration of a known switching circuit.
Figure 7:
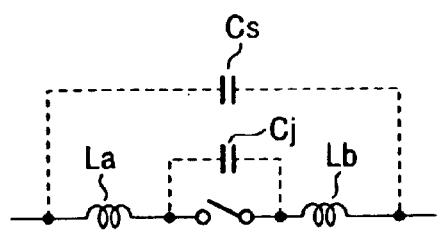
FIG. 7 is an equivalent circuit diagram of the known switching circuit.
Figure 8:
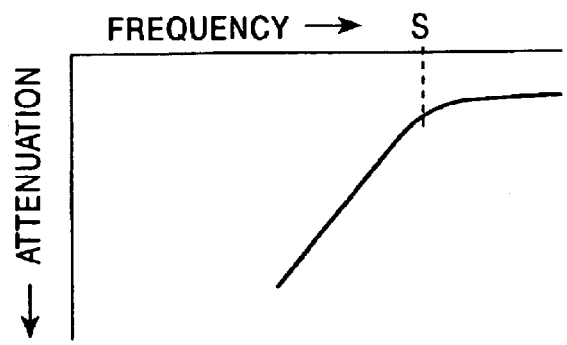
FIG. 8 is a graph showing the transmission characteristics of the known switching circuit.

Referring to FIG. 5, four switching diodes 4 (4-1 to 4-4), the switching diodes 4 being the diode used in the above-described switching circuit, are bridged. The cathodes of the switching diodes 4-1 and 4-2 are both connected to a first output terminal 13. The cathodes of the switching diodes 4-3 and 4-4 are both connected to a second output terminal 14. The anodes of the switching diodes 4-1 and 4-3 are connected to a first input terminal 11. The anodes of the switching diodes 4-2 and 4-4 are connected to a second input terminal 12.

The switching diodes 4-1 and 4-2, whose cathodes are connected to each other, are operated so that one of the switching diodes 4-1 and 4-2 is turned on while the other is turned off. Similarly, the switching diodes 4-3 and 4-4, whose cathodes are connected to each other, are operated so that one of the switching diodes 4-3 and 4-4 is turned on while the other is turned off. As a result, a signal input to the input terminal 11 can be output to the output terminal 13 or 14, and a signal input to the input terminal 12 can be output to the output terminal 13 or 14. In this case, isolation of a signal other than that output to the output terminal 13 or 14 can be improved.

What is claimed is:

1. A switching circuit comprising:

an insulating substrate including two signal transmission lines;

a switching diode mounted, in series between the two signal transmission lines, on the insulating substrate, wherein an anode terminal and a cathode terminal of the switching diode are connected to the two signal transmission lines, and the switching diode is turned on or off;

a conductive pattern formed on a mounting face under the switching diode of the insulating substrate on which the switching diode is mounted, the conductive pattern being grounded; and, capacitors formed between each end of the anode terminal and the conductive pattern and between each end of the cathode terminal and the conductive pattern, wherein an inductor in the anode terminal, an inductor in the cathode terminal, and the capacitors constitute a low-pass filter.

2. A switching circuit according to claim 1, wherein the conductive pattern extends to both sides of the switching diode in a direction orthogonal to a direction in which the anode and cathode terminals of the switching diode are connected with each other, and the conductive pattern is grounded at both sides of the switching diode.

3. A switching circuit according to claim 2, wherein a ground conductor is formed on a face opposite to a the mounting face of the insulating substrate and through holes connected to the conductive pattern are provided at both sides of the switching diode, and the conductive pattern is connected to the ground conductor through the through holes.

* * * * *

UNITED STATES PATENT AND TRADEMARK OFFICE
CERTIFICATE OF CORRECTION

PATENT NO.   : 6,800,935 B2
DATED        : October 5, 2004
INVENTOR(S)  : Toshiharu Yoneda It is certified that error appears in the above-identified patent and that said Letters Patent is hereby corrected as shown below:

<u>Column 4,</u>
Line 36, after "opposite to" delete "a".
Line 37, immediately after "substrate" insert -- , -- (comma).

Signed and Sealed this

Twenty-ninth Day of November, 2005

JON W. DUDAS
*Director of the United States Patent and Trademark Office*